United States Patent
Ohashi et al.

(10) Patent No.: US 10,453,783 B2
(45) Date of Patent: Oct. 22, 2019

(54) POWER MODULE SUBSTRATE

(71) Applicant: MITSUBISHI MATERIALS CORPORATION, Tokyo (JP)

(72) Inventors: Toyo Ohashi, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/301,093

(22) PCT Filed: May 17, 2017

(86) PCT No.: PCT/JP2017/018518
§ 371 (c)(1),
(2) Date: Nov. 13, 2018

(87) PCT Pub. No.: WO2017/200004
PCT Pub. Date: Nov. 23, 2017

(65) Prior Publication Data
US 2019/0189548 A1    Jun. 20, 2019

(30) Foreign Application Priority Data
May 19, 2016    (JP) ................. 2016-100615

(51) Int. Cl.
*H01L 23/498* (2006.01)
*H05K 1/02* (2006.01)
(Continued)

(52) U.S. Cl.
CPC ........ *H01L 23/49822* (2013.01); *B23K 35/22* (2013.01); *C04B 37/026* (2013.01); *H05K 1/0298* (2013.01); *H05K 1/0306* (2013.01)

(58) Field of Classification Search
CPC .. H01L 23/49822; B23K 35/22; C04B 37/026
See application file for complete search history.

(56) References Cited

U.S. PATENT DOCUMENTS 5,998,043 A * 12/1999 Sasaki ................. C04B 37/026
257/703
8,749,052 B2 * 6/2014 Schulz-Harder .... H01L 23/3735
257/675

(Continued)

FOREIGN PATENT DOCUMENTS

JP   10-326949 A   12/1998
JP   2001-102521 A   4/2001

(Continued)

OTHER PUBLICATIONS

International Search Report dated Aug. 1, 2017, issued for PCT/JP2017/018518 and English translation thereof.

*Primary Examiner* — William H. Mayo, III
*Assistant Examiner* — Hiram E Gonzalez
(74) *Attorney, Agent, or Firm* — Locke Lord LLP (57) ABSTRACT

A power module substrate of the present invention includes a ceramic substrate and a circuit layer having a circuit pattern. In an interface between the circuit layer and the ceramic substrate, a Cu—Sn layer and a Ti-containing layer are laminated in this order from the ceramic substrate side. In a cross-sectional shape of an end portion of the circuit pattern of the circuit layer, an angle θ formed between a surface of the ceramic substrate and an end face of the Cu—Sn layer is set in a range equal to or greater than 80° and equal to or smaller than 100°, and a maximum protrusion length L of the Cu—Sn layer or the Ti-containing layer from an end face of the circuit layer is set in a range equal to or greater than 2μm and equal to or smaller than 15 μm.

2 Claims, 7 Drawing Sheets

(51) Int. Cl.
*C04B 37/02* (2006.01)
*B23K 35/22* (2006.01)
*H05K 1/03* (2006.01)

(56) References Cited

U.S. PATENT DOCUMENTS

| | | | |
|---|---|---|---|
| 9,277,639 B2* | 3/2016 | Kato | H01L 23/3735 |
| 2016/0152004 A1* | 6/2016 | Niino | B32B 15/01 |
| | | | 428/663 |

FOREIGN PATENT DOCUMENTS

| | | |
|---|---|---|
| JP | 4375730 B2 | 12/2009 |
| JP | 2015-043392 A | 3/2015 |
| JP | 2015-065423 A | 4/2015 |
| WO | 2013/094213 A1 | 6/2013 |

* cited by examiner

POWER MODULE SUBSTRATE

TECHNICAL FIELD

The present invention relates to a power module substrate including a ceramic substrate and a circuit layer which is formed on one surface of the ceramic substrate and has a circuit pattern.

Priority is claimed on Japanese Patent Application No. 2016-100615, filed on May 19, 2016, the content of which is incorporated herein by reference.

BACKGROUND ART

A semiconductor device such as LED or a power module has a structure in which a semiconductor element is bonded to the top of a circuit layer formed of a conductive material.

A power semiconductor element for high power control that is used for controlling wind power generation, an electric vehicle such as an electromobile, and the like generates a large amount of heat. Accordingly, as a substrate on which such an element is mounted, a power module substrate obtained by bonding a metal sheet as a circuit layer having excellent conductivity to one surface of a ceramic substrate formed of, for example, aluminum nitride (AlN) has been widely used in the related art. Furthermore, sometimes a metal sheet is bonded as a metal layer to the other surface of the ceramic substrate.

For example, a power module substrate described in PTL 1 has a structure in which a circuit layer is formed by bonding a Cu foil to one surface of a ceramic substrate. In the power module substrate, the Cu foil is disposed on one surface of the ceramic substrate through a Cu—Mg—Ti brazing filler material interposed therebetween, and a heat treatment is performed to bond the Cu foil.

Incidentally, in a case where the ceramic substrate and the Cu foil are bonded to each other through the Cu—Mg—Ti brazing filler material as disclosed in PTL 1, an intermetallic compound containing Cu, Mg, or Ti is formed in the vicinity of the ceramic substrate.

The intermetallic compound formed in the vicinity of the ceramic substrate is hard. Therefore, in a case where a thermal cycle is loaded on the power module substrate, a high thermal stress is caused in the ceramic substrate. Accordingly, unfortunately, the ceramic substrate easily cracks.

In addition, in a case where the hard intermetallic compound is formed in the vicinity of the ceramic substrate at the time of bonding the ceramic substrate and the circuit layer to each other, a bonding rate between the ceramic substrate and the circuit layer may be reduced, and the ceramic substrate and the circuit layer may not be able to be excellently bonded to each other.

Therefore, for example, PTLs 2 and 3 suggest a power module substrate in which a ceramic substrate and a copper foil which becomes a circuit layer are bonded to each other by using a Cu—P—Sn-based brazing filler material and a Ti material.

In the inventions described in PTLs 2 and 3, a Cu—Sn layer is formed on the ceramic substrate side, a metal compound layer containing Ti is formed on the Cu—Sn layer, and a hard intermetallic compound layer is not provided in the vicinity of the ceramic substrate. Therefore, the thermal stress caused in the ceramic substrate in a case where a thermal cycle is loaded can be reduced, and the occurrence of cracking in the ceramic substrate can be inhibited.

CITATION LIST

Patent Literature

[PTL1] Japanese Patent No. 4375730
[PTL 2] Japanese Unexamined Patent Application, First Publication No. 2015-043392
[PTL 3] Japanese Unexamined Patent Application, First Publication No. 2015-065423

SUMMARY OF INVENTION

Technical Problem

Incidentally, in the power module substrates shown in PTLs 2 and 3, in order to form a circuit pattern on the circuit layer, an etching treatment is performed in some cases. At the time of performing the etching treatment, in a case where an etching agent suitable for etching of the copper foil which becomes a circuit layer is used, because the etching speed of the Cu—Sn layer and the intermetallic compound layer is different from the etching speed of the copper foil, sometimes the Cu—Sn layer and the intermetallic compound layer remain on an end face (etching end face) of the circuit pattern. Depending on the shape of the Cu—Sn layer and the intermetallic compound layer that have remained, it is apprehended that local concentration of charge may occur in an end portion of the circuit pattern of the circuit layer, and hence partial discharge characteristics and voltage endurance characteristics may deteriorate.

The present invention has been made in consideration of the circumstances described above, and an object thereof is to provide a power module substrate in which in a circuit layer formed on one surface of a ceramic substrate, the shape of an end portion of a circuit pattern is prescribed such that the deterioration of partial discharge characteristics and voltage endurance characteristics can be inhibited.

Solution to Problem

In order to achieve the aforementioned object, the present invention provides a power module substrate including a ceramic substrate and a circuit layer which is formed on one surface of the ceramic substrate and has a circuit pattern, in which the circuit layer is made of Cu or a Cu alloy; in an interface between the circuit layer and the ceramic substrate, a Cu—Sn layer in which Sn forms a solid solution in Cu and a Ti-containing layer containing Ti are laminated in this order from the ceramic substrate side; and in a cross-sectional shape of an end portion of the circuit pattern of the circuit layer, an angle θ formed between a surface of the ceramic substrate and an end face of the Cu—Sn layer is set in a range equal to or greater than 80° and equal to or less than 100°, and a maximum protrusion length L of the Cu—Sn layer or the Ti-containing layer from an end face of the circuit layer is set in a range equal to or greater than 2 μm equal to or less than 15 μm.

According to the power module substrate of the present invention, the circuit layer is made of Cu or a Cu alloy; the Cu—Sn layer and the Ti-containing layer are laminated and disposed in the interface between the circuit layer and the ceramic substrate; and in the cross-sectional shape of the end portion of the circuit pattern of the circuit layer, the angle θ formed between the surface of the ceramic substrate and the end face of the Cu—Sn layer is set in a range equal to or greater than 80° and equal to or less than 100°. Therefore, a site having an acute-angled shape is not formed in the end portion of the circuit pattern, and charge concentration can be inhibited. As a result, the occurrence of partial discharge can be inhibited.

Furthermore, because the maximum protrusion length L of the Cu—Sn layer or the Ti-containing layer from the end face of the circuit layer is set in a range equal to or greater than 2 μm and equal to or less than 15 μm, it is possible to inhibit charges from being concentrated on the tip of a protruding portion and to inhibit the deterioration of partial discharge characteristics and voltage endurance characteristics.

Herein, in the power module substrate of the present invention, in the cross-sectional shape of the end portion of the circuit pattern of the circuit layer, the end face of the Ti-containing layer is preferably positioned on an extended plane of the end face of the Cu—Sn layer.

In this case, the Cu—Sn layer and the Ti-containing layer are smoothly connected to each other. Accordingly, it is possible to inhibit charges from being concentrated on the interface between the Cu—Sn layer and the Ti-containing layer and to further inhibit the deterioration of partial discharge characteristics and voltage endurance characteristics.

Advantageous Effects of Invention

According to the present invention, it is possible to provide a power module substrate in which in a circuit layer formed on one surface of a ceramic substrate, the shape of an end portion of a circuit pattern is prescribed such that the deterioration of partial discharge characteristics and voltage endurance characteristics can be inhibited.

DESCRIPTION OF EMBODIMENTS

Hereinafter, embodiments of the present invention will be described with reference to the attached drawings. In the following description, "brazing filler material" is not limited to materials containing lead.

Figure 1:
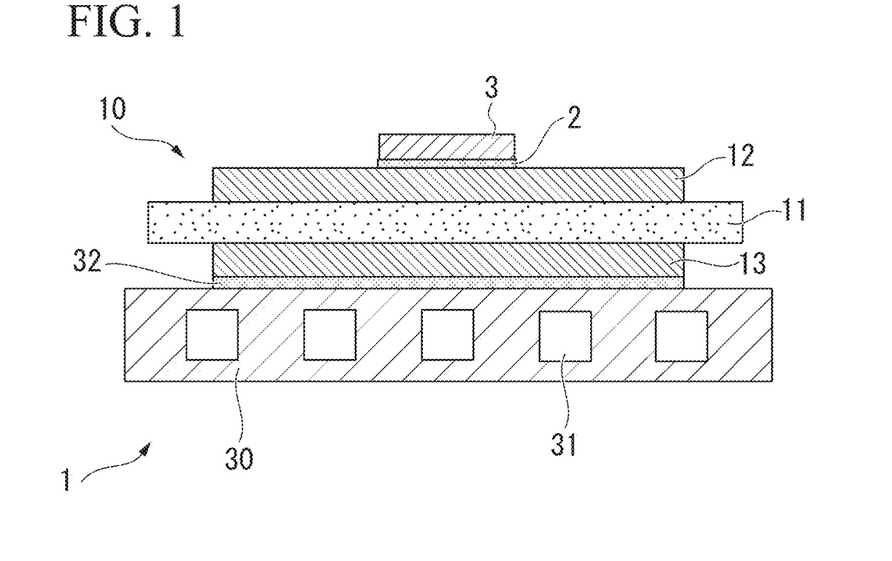
FIG. 1 is a view schematically describing a power module in which a power module substrate according to an embodiment of the present invention is used.

FIG. 1 shows a power module 1 including a power module substrate 10 according to the present embodiment.

The power module 1 includes the power module substrate 10 provided with a circuit layer 12 and a metal layer 13, a semiconductor element 3 bonded to one surface (upper surface in FIG. 1) of the circuit layer 12 through a bonding layer 2, and a heat sink 30 bonded to the other side (lower side in FIG. 1) of the power module substrate 10 through a bonding layer 32.

As shown in FIG. 1, the power module substrate 10 includes a ceramic substrate 11, the circuit layer 12 provided on one surface (upper surface in FIG. 1) of the ceramic substrate 11, and the metal layer 13 provided on the other surface (lower surface in FIG. 1) of the ceramic substrate 11.

The ceramic substrate 11 is constituted with ceramics such as aluminum nitride (AlN), silicon nitride ($Si_3N_4$), and alumina ($Al_2O_3$) having high insulating properties. In the present embodiment, the ceramic substrate 11 is constituted with aluminum nitride (AlN) having excellent heat radiation properties. The thickness of the ceramic substrate 11 is set within a range of 0.2 to 1.5 mm. In the present embodiment, the thickness of the ceramic substrate 11 is set to be 0.635 mm.

The circuit layer 12 is formed by bonding a Cu foil 22 formed of Cu or a Cu alloy having conductivity to one surface of the ceramic substrate 11.

Figure 6:
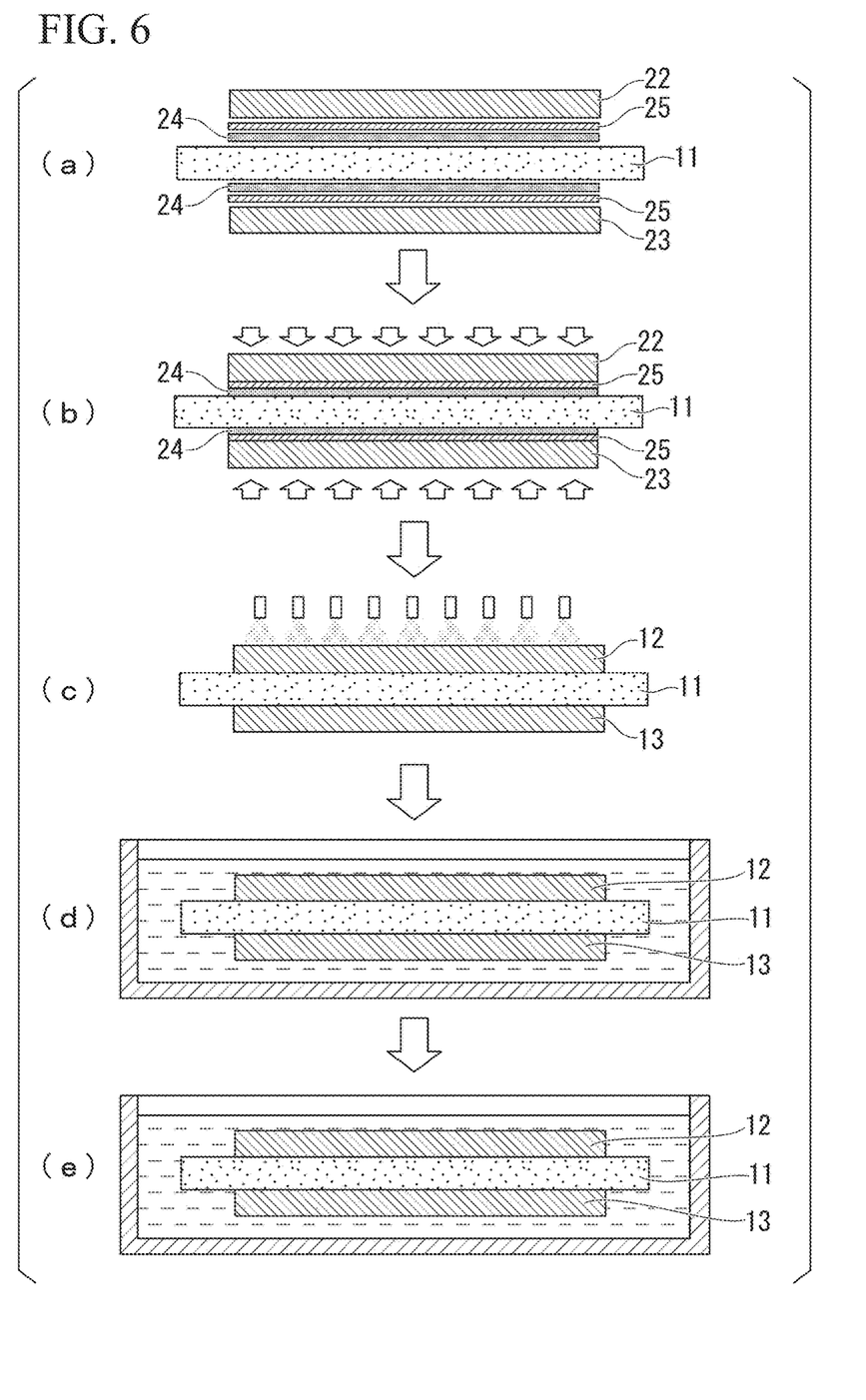
FIG. 6 is a view schematically describing a method for manufacturing a power module substrate according to an embodiment of the present invention.

In the present embodiment, as shown in FIG. 6, the circuit layer 12 is formed by laminating a Cu—P—Sn-based brazing filler material 24, a Ti material 25, and the Cu foil 22 formed of oxygen-free copper on one surface of the ceramic substrate 11 and performing heating such that the Cu foil 22 is bonded to the ceramic substrate 11. In the present embodiment, as the Cu—P—Sn-based brazing filler material 24, a Cu—P—Sn—Ni brazing filler material is used.

The thickness of the circuit layer 12 is set within a range equal to or greater than 0.1 mm and equal to or smaller than 1.0 mm. In the present embodiment, the thickness of the circuit layer 12 is set to be 0.3 mm.

The metal layer 13 is formed by bonding a Cu foil 23 formed of Cu or a Cu alloy to the other surface of the ceramic substrate 11 through the Cu—P—Sn-based brazing filler material 24. In the present embodiment, as shown in FIG. 6, the metal layer 13 is formed by laminating the Cu—P—Sn-based brazing filler material 24, the Ti material 25, and the Cu foil 23 formed of oxygen-free copper on the other surface of the ceramic substrate 11 and performing a heat treatment such that the Cu foil 23 is bonded to the ceramic substrate 11. In the present embodiment, as the Cu—P—Sn-based brazing filler material 24, a Cu—P—Sn—Ni brazing filler material is used.

The thickness of the metal layer 13 is set within a range equal to or greater than 0.1 mm and equal to or smaller than 1.0 mm. In the present embodiment, the thickness of the metal layer 13 is set to be 0.3 mm.

Figure 2:
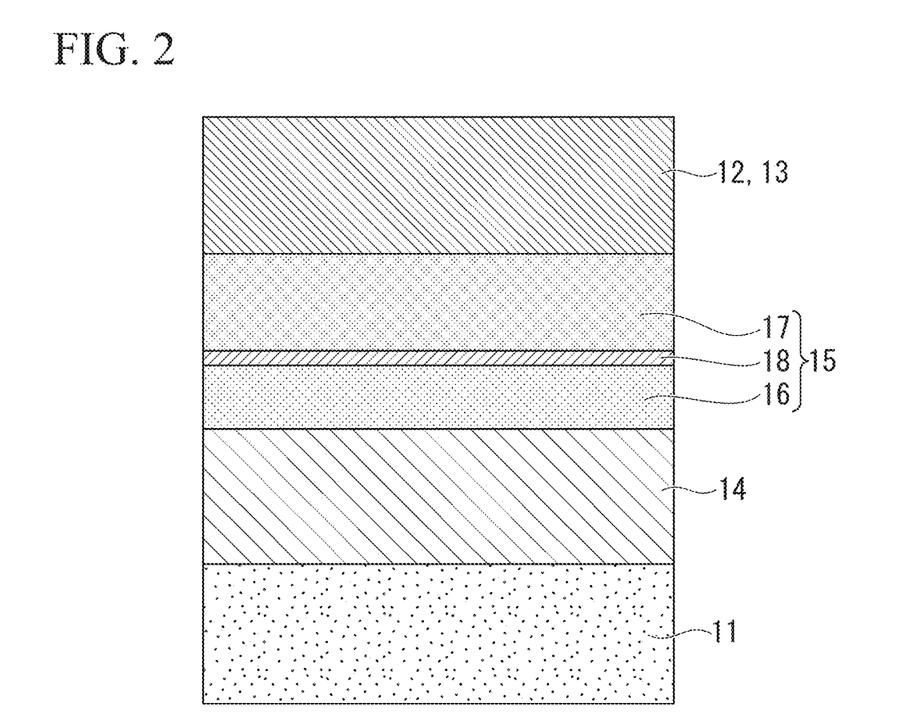
FIG. 2 is a cross-sectional view schematically describing a bonded interface between a circuit layer and a ceramic substrate in the power module substrate shown in FIG. 1.

FIG. 2 is a view schematically describing a bonded interface between the ceramic substrate 11 and the circuit layer 12 (metal layer 13). As shown in FIG. 2, in the bonded interface between the ceramic substrate 11 and the circuit layer 12 (metal layer 13), a structure is established in which a Cu—Sn layer 14 positioned on the ceramic substrate 11 side and a Ti-containing layer 15 containing Ti are laminated. In the present embodiment, the Ti-containing layer 15 has a structure in which a first intermetallic compound layer 16 which contains Ti and P, a Ti layer 18, and a second intermetallic compound layer 17 which contains Cu and Ti are laminated. In the Cu—Sn layer 14, Sn forms a solid solution in Cu. The first intermetallic compound layer 16 is mainly constituted with Ti and P, the Ti layer 18 is mainly constituted with Ti, and the second intermetallic compound layer 17 is mainly constituted with Cu and Ti. However, these layers may also contain other elements.

The semiconductor element 3 is constituted with a semiconductor material such as Si. The semiconductor element 3 and the circuit layer 12 are bonded to each other through a bonding layer 2.

The bonding layer 2 is formed of a solder material based on Sn—Ag, Sn—In, or Sn—Ag—Cu, for example.

The heat sink 30 dissipates the heat from the aforementioned power module substrate 10. The heat sink 30 is constituted with Cu or a Cu alloy. In the present embodiment, the heat sink 30 is constituted with phosphorus deoxidized copper. The heat sink 30 is provided with passages 31 for a cooling fluid to flow through the passages. In the present embodiment, the heat sink 30 and the metal layer 13 are bonded to each other through the bonding layer 32 formed of a solder material.

In the circuit layer 12 of the power module substrate 10 as the present embodiment, a circuit pattern is formed by performing an etching treatment.

In the cross-sectional shape of an end portion of the circuit pattern of the circuit layer 12, an angle θ formed between a surface of the ceramic substrate 11 and an end face of the Cu—Sn layer 14 is set in a range equal to or greater than 80° and equal to or smaller than 100°. Furthermore, a maximum protrusion length L of the Cu—Sn layer 14 or the Ti-containing layer 15 from an end face of the circuit layer 12 (maximum length of the Cu—Sn layer 14 and the Ti-containing layer 15 protruding from an end face of the circuit layer 12) is set in a range equal to or greater than 2 μm and equal to or smaller than 15 μm.

The end portion of the circuit pattern is one end portion of wiring included in the circuit pattern. The cross-sectional shape of the end portion of the circuit pattern is the shape of the end portion of the circuit pattern in a cross section which is perpendicular to the surface of the ceramic substrate 11 and is parallel to the direction along which the wiring in the end portion of the circuit pattern extends. For determining the angle θ, a straight line, which connects the bonding end of the ceramic substrate 11 and the Cu—Sn layer 14 in the cross section to a midpoint between the highest point and the lowest point of surface asperities of the ceramic substrate 11 that are within a range of 20 nm from the bonding end in a horizontal direction, is defined as the surface of the ceramic substrate 11. The maximum protrusion length L is a maximum length between the end of the end face of the circuit layer 12 on the Ti-containing layer 15 side in the cross section and end faces of the Cu—Sn layer 14 and the Ti-containing layer 15 protruding from the end face of the circuit layer 12, in a direction parallel to the surface of the ceramic substrate 11. In order to obtain the effects, which will be described later, obtained by setting the angle θ and the maximum protrusion length L within the range described above, the angle θ and the maximum protrusion length L preferably fall into the aforementioned range in one end portion of at least one wiring included in the circuit pattern, more preferably fall into the aforementioned range in both end portions of at least one wiring included in the circuit pattern, and even more preferably fall into the aforementioned range in both end portions of all wiring of the circuit pattern.

Specific examples of the cross-sectional shape of the end portion of the circuit pattern of the circuit layer 12 will be described with reference to FIG. 3 and FIG. 4.

Figure 3:
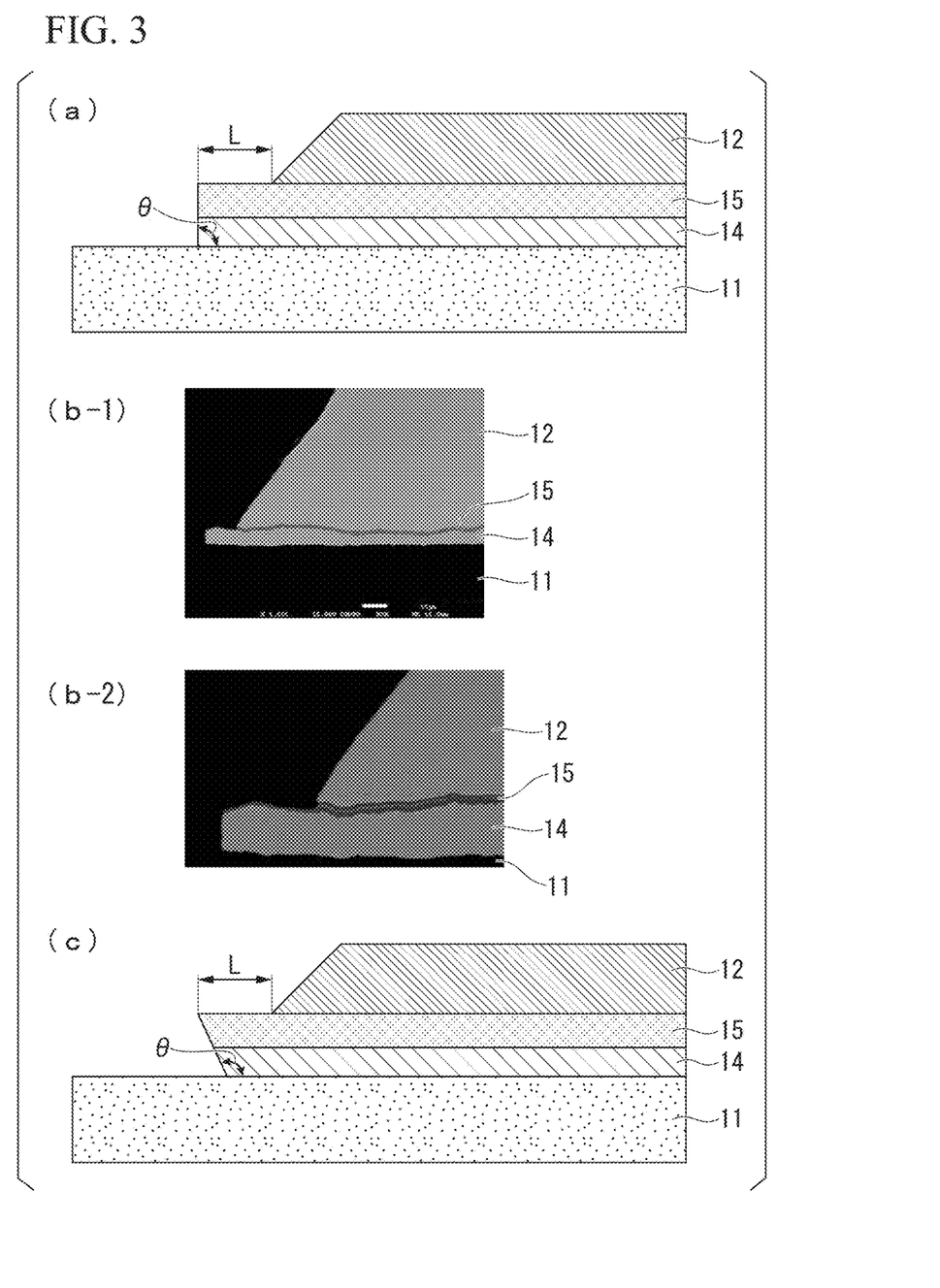
FIG. 3 shows views schematically describing specific examples of a cross-sectional shape of an end portion of a circuit pattern formed in the circuit layer of the power module substrate shown in FIG. 1, and shows images obtained by SEM observation.

In FIG. 3(*a*), the angle θ formed between the surface of the ceramic substrate 11 and the end face of the Cu—Sn layer 14 is approximately 90° in the end portion of the circuit pattern (88°≤θ≤92°), and the maximum protrusion length L of the Cu—Sn layer 14 or the Ti-containing layer 15 from the end face of the circuit layer 12 is equal to or smaller than 15 μm. Note that FIG. 3(*b*-1) is an image obtained by SEM observation, and FIG. 3(*b*-2) is a view obtained by magnifying the vicinity of the end portion of the circuit pattern in FIG. 3(*b*-1). As is evident from FIG. 3(*b*-2), the Ti-containing layer 15 is also observed in the portion protruding from the end face of the circuit layer 12.

In FIG. 3(*c*), the angle θ formed between the surface of the ceramic substrate 11 and the end face of the Cu—Sn layer 14 is within a range greater than 90° and equal to or smaller than 100° in the end portion of the circuit pattern, and the maximum protrusion length L of the Cu—Sn layer 14 or the Ti-containing layer 15 from the end face of the circuit layer 12 is equal to or smaller than 15 μm. Furthermore, the end face of the Ti-containing layer 15 is positioned on an extended plane of the end face of the Cu—Sn layer 14.

Figure 4:
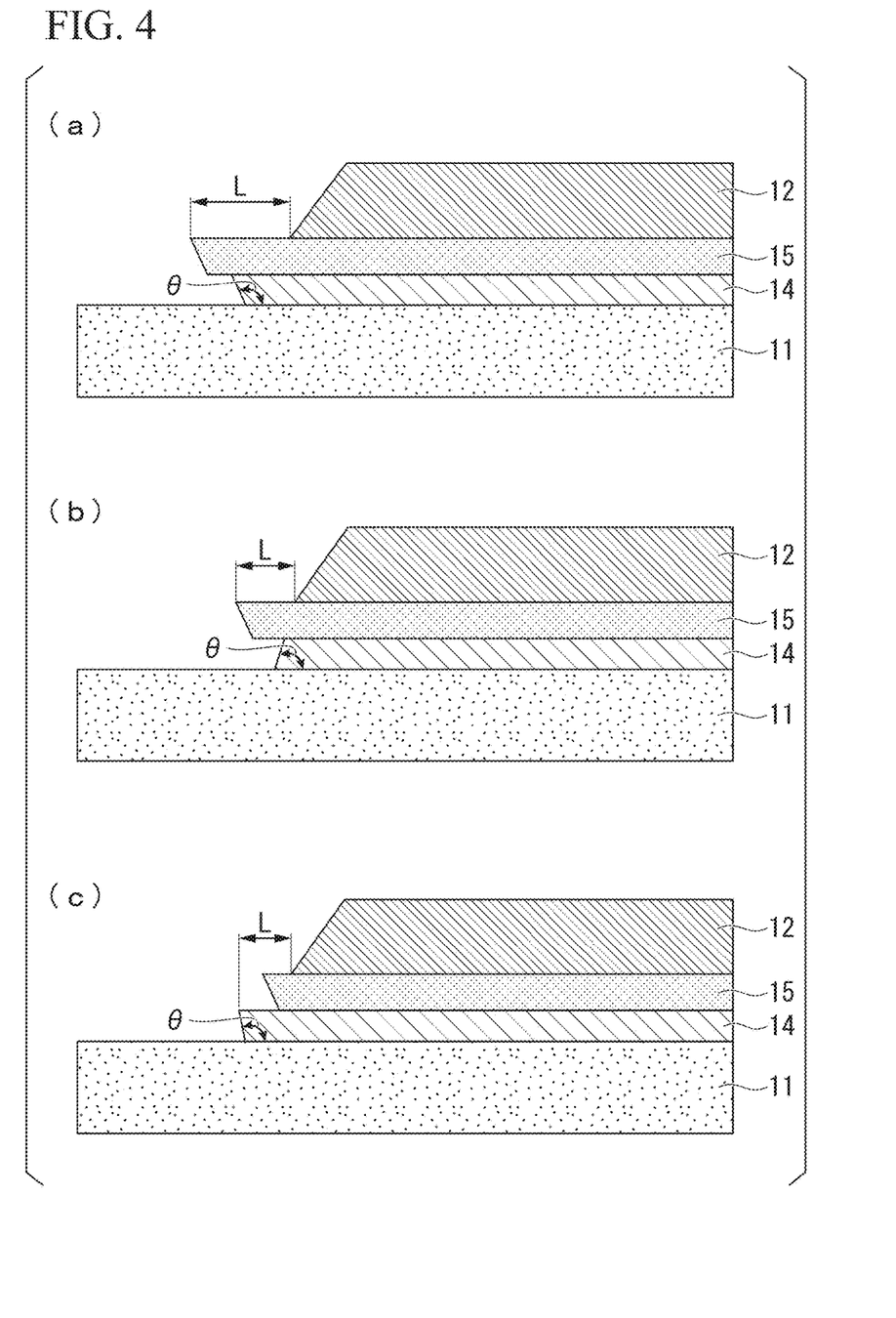
FIG. 4 shows views schematically describing specific examples of the cross-sectional shape of the end portion of the circuit pattern formed in the circuit layer of the power module substrate shown in FIG. 1.

In FIG. 4(*a*), the angle θ formed between the surface of the ceramic substrate 11 and the end face of the Cu—Sn layer 14 is within a range equal to or greater than 90° and equal to or smaller than 100° in the end portion of the circuit pattern, and the maximum protrusion length L of the Cu—Sn layer 14 or the Ti-containing layer 15 from the end face of the circuit layer 12 is equal to or smaller than 15 μm. Furthermore, the end face of the Ti-containing layer 15 protrudes further toward the outside (direction separating from the end face of the circuit layer 12) compared to the end face of the Cu—Sn layer 14.

In FIG. 4(*b*), the angle θ formed between the surface of the ceramic substrate 11 and the end face of the Cu—Sn layer 14 is within a range greater than 80° and less than 90° in the end portion of the circuit pattern, and the maximum protrusion length L of the Cu—Sn layer 14 or the Ti-containing layer 15 from the end face of the circuit layer 12 is equal to or smaller than 15 μm. Furthermore, the end face of the Ti-containing layer 15 protrudes further toward the outside compared to the end face of the Cu—Sn layer 14.

In FIG. 4(*c*), the angle θ formed between the surface of the ceramic substrate 11 and the end face of the Cu—Sn layer 14 is within a range greater than 90° and equal to or smaller than 100° in the end portion of the circuit pattern, and the maximum protrusion length L of the Cu—Sn layer 14 or the Ti-containing layer 15 from the end face of the circuit layer 12 is equal to or smaller than 15 μm. Furthermore, the end face of the Cu—Sn layer 14 protrudes further toward the outside compared to the end face of the Ti-containing layer 15.

In the shapes shown in FIG. 3(*a*) and FIG. 3(*c*), the end face of the Ti-containing layer 15 is positioned on an extended plane of the end face of the Cu—Sn layer 14. It is difficult for charges to be concentrated on the interface between the Ti-containing layer 15 and the Cu—Sn layer 14, and the deterioration of partial discharge characteristics and voltage endurance characteristics can be sufficiently inhibited.

Note that in the shapes shown in FIG. 4(*a*), FIG. 4(*b*), and FIG. 4(*c*), in a case where the angle θ formed between the surface of the ceramic substrate 11 and the end face of the Cu—Sn layer 14 is set within a range equal to or greater than 80° and equal to or smaller than 100°, and the maximum protrusion length L of the Cu—Sn layer 14 or the Ti-containing layer 15 from the end face of the circuit layer 12 is set within a range equal to or greater than 2 μm and equal to or smaller than 15 μm, it is possible to obtain an effect of inhibiting the deterioration of partial discharge characteristics and voltage endurance characteristics.

The angle θ is preferably equal to or greater than 85° and equal to or smaller than 95° and more preferably equal to or greater than 88° and equal to or smaller than 92°, but is not limited to these. Furthermore, the maximum protrusion length L is preferably equal to or smaller than 10 μm and more preferably equal to or smaller than 5 μm, but is not limited to these.

Figure 5:
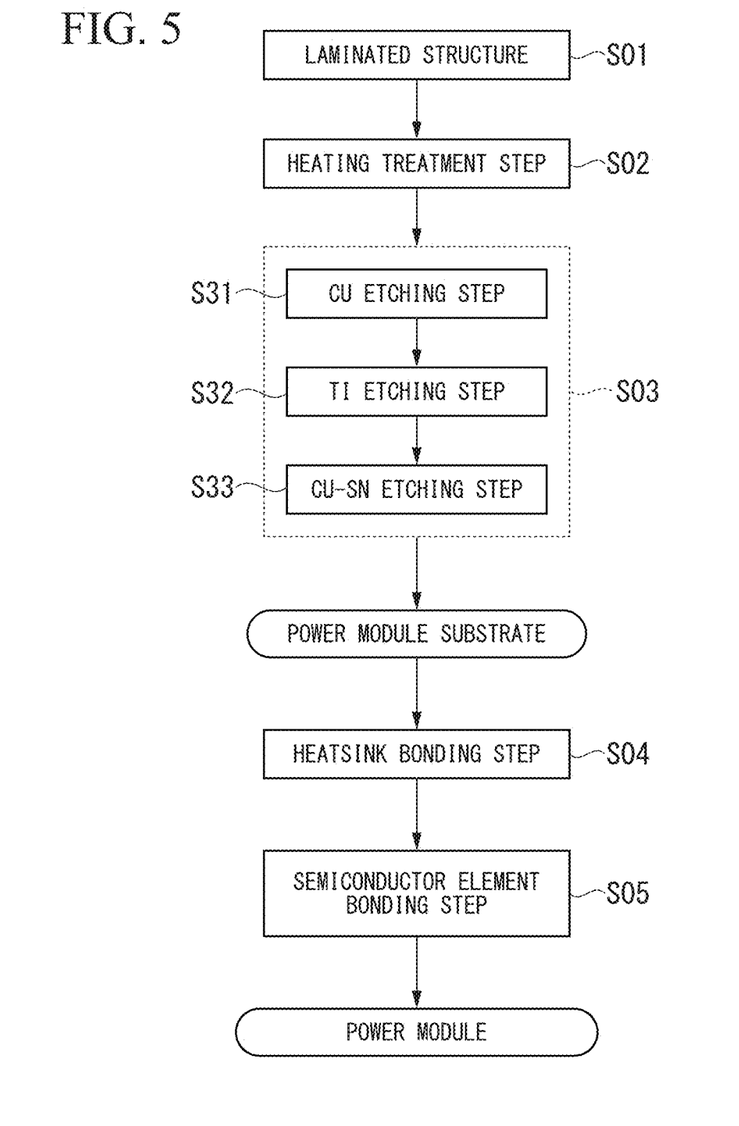
FIG. 5 is a flowchart of a method for manufacturing a power module substrate according to an embodiment of the present invention and a method for manufacturing a power module.

Next, a method for manufacturing the power module substrate 10 as the present embodiment will be described with reference to FIG. 5 and FIG. 6.

(Lamination Step S01)

First, as shown in FIG. 6, the Cu—P—Sn-based brazing filler material 24, the Ti material 25, and the Cu foil 22 which becomes the circuit layer 12 are laminated in this order on one surface (upper surface in FIG. 6) of the ceramic substrate 11, and the Cu—P—Sn-based brazing filler material 24, the Ti material 25, and the Cu foil 23 which becomes the metal layer 13 are laminated in this order on the other surface (lower surface in FIG. 6) of the ceramic substrate 11 (FIG. 6(a)). That is, between the ceramic substrate 11 and the Cu foil 22 and between the ceramic substrate 11 and the Cu foil 23, the Cu—P—Sn-based brazing filler material 24 is disposed on the ceramic substrate 11 side, and the Ti material 25 is disposed on the Cu foil 22 side and the Cu foil 23 side. The bonding surface between the Ti material 25 and the Cu foil 22 or 23 is a surface that is made smooth in advance.

In the present embodiment, the composition of the Cu—P—Sn-based brazing filler material 24 is Cu-6.3 mass % P-9.3 mass % Sn-7 mass % Ni. The solidus temperature (melting start temperature) of the Cu—P—Sn-based brazing filler material 24 is 600° C. Furthermore, in the present embodiment, as the Cu—P—Sn-based brazing filler material 24, a foil material is used, and the thickness thereof is within a range equal to or greater than 5 μm and equal to or smaller than 150 μm.

The thickness of the Ti material 25 is within a range equal to or greater than 0.4 μm and equal to or smaller than 5 μm. In a case where the thickness of the Ti material 25 is equal to or greater than 0.4 μm and less than 1 μm, it is preferable to deposit the Ti material 25 by vapor deposition or sputtering. In a case where the thickness of the Ti material 25 is equal to or greater than 1 μm and equal to or smaller than 5 μm, it is preferable to use a foil material. The lower limit of the thickness of the Ti material 25 is preferably equal to or greater than 0.4 μm, and more preferably equal to or greater than 0.5 μm. The upper limit of the thickness of the Ti material 25 is preferably equal to or smaller than 1.5 μm, and more preferably equal to or smaller than 0.7 μm In the present embodiment, as the Ti material 25, a Ti foil having a thickness of 1 μm and a purity of 99.8 mass % is used.

(Heat Treatment Step S02)

Then, the Cu foil 22, the Ti material 25, the Cu—P—Sn-based brazing filler material 24, the ceramic substrate 11, the Cu—P—Sn-based brazing filler material 24, the Ti material 25, and the Cu foil 23 are put into a vacuum heating furnace in a state where pressure (equal to or higher than 1 kgf/cm² and equal to or lower than 35 kgf/cm² (equal to or higher than 0.10 MPa and equal to or lower than 3.43 MPa)) is applied thereto in the lamination direction, and heated (FIG. 6(b)). In the present embodiment, the internal pressure of the vacuum heating furnace is set within a range equal to or higher than $10^{-6}$ Pa and equal to or lower than $10^{-3}$ Pa, the heating temperature is set within a range equal to or higher than 560° C. and equal to or lower than 650° C., and the heating time is set within a range equal to or longer than 30 minutes and equal to or shorter than 360 minutes.

In the heat treatment step S02, the Ti material 25 and the Cu foils 22 and 23 are bonded to each other by diffusion in solids, and the Cu—P—Sn-based brazing filler material 24 is melted and forms a liquid phase. By the solidification of the liquid phase, through the Cu—P—Sn-based brazing filler material 24, the ceramic substrate 11 and the Ti material 25 are bonded to each other. At this time, in the bonded interface between the circuit layer 12 and the ceramic substrate 11 and between the metal layer 13 and the ceramic substrate 11, the Cu—Sn layer 14 and the Ti-containing layer 15 are formed.

Accordingly, the circuit layer 12 is formed on one surface of the ceramic substrate 11, and the metal layer 13 is formed on the other surface of the ceramic substrate 11.

(Circuit Pattern Forming Step S03)

Then, by performing an etching treatment on the circuit layer 12, a circuit pattern is formed.

In the present embodiment, first, a resist film is deposited on the circuit layer, and the circuit layer 12 formed of Cu or a Cu alloy is etched (Cu etching step S31). In the Cu etching step S31, it is preferable to use an etching agent containing, for example, ferric chloride, cupric chloride, sulfuric acid, and the like. In the present embodiment, in the Cu etching step S31, a spray etching method is used (FIG. 6(c)).

After the Cu etching step S31, the Ti-containing layer 15 is etched (Ti etching step S32). In the Ti etching step S32, it is preferable to use an etching agent obtained by, for example, adding organic acid ammonium to aqueous hydrogen peroxide. As the etching agent, for example, SOLFINE (SE-TW-10) manufactured by SHOWA DENKO K.K. can be used.

The etching may be performed under the conditions of a temperature of 70° C. to 80° C. and an etching time of 5 minutes to 20 minutes. Note that in the present embodiment, an immersion etching method is used in the Ti etching step S32 (FIG. 6(d)).

After the Ti etching step S32, the Cu—Sn layer 14 is etched (Cu—Sn etching step S33). In the Cu—Sn etching step S33, for example, an aqueous ammonium peroxydisulfate solution can be used. The etching may be performed under the conditions of a liquid temperature of 25° C. (room temperature) and an etching time of 10 minutes to 20 minutes. Note that in the present embodiment, an immersion etching method is used in the Cu—Sn etching step S33 (FIG. 6(e)).

By the circuit pattern forming step S03, a circuit pattern is formed on the circuit layer 12. Furthermore in the cross-sectional shape of the end portion of the circuit pattern, the angle θ formed between the surface of the ceramic substrate 11 and the end face of the Cu—Sn layer 14 is set in a range equal to or greater than 80° and equal to or smaller than 100°, and the maximum protrusion length L of the Cu—Sn layer 14 or the Ti-containing layer 15 from the end face of the circuit layer 12 is set in a range equal to or greater than 2 μm and equal to or smaller than 15 μm. Note that by etching, it is difficult to make the maximum protrusion length L become less than 2 μm.

Through the steps described above, the power module substrate 10 as the present embodiment is manufactured.

(Heat Sink Bonding Step S04)

Figure 7:
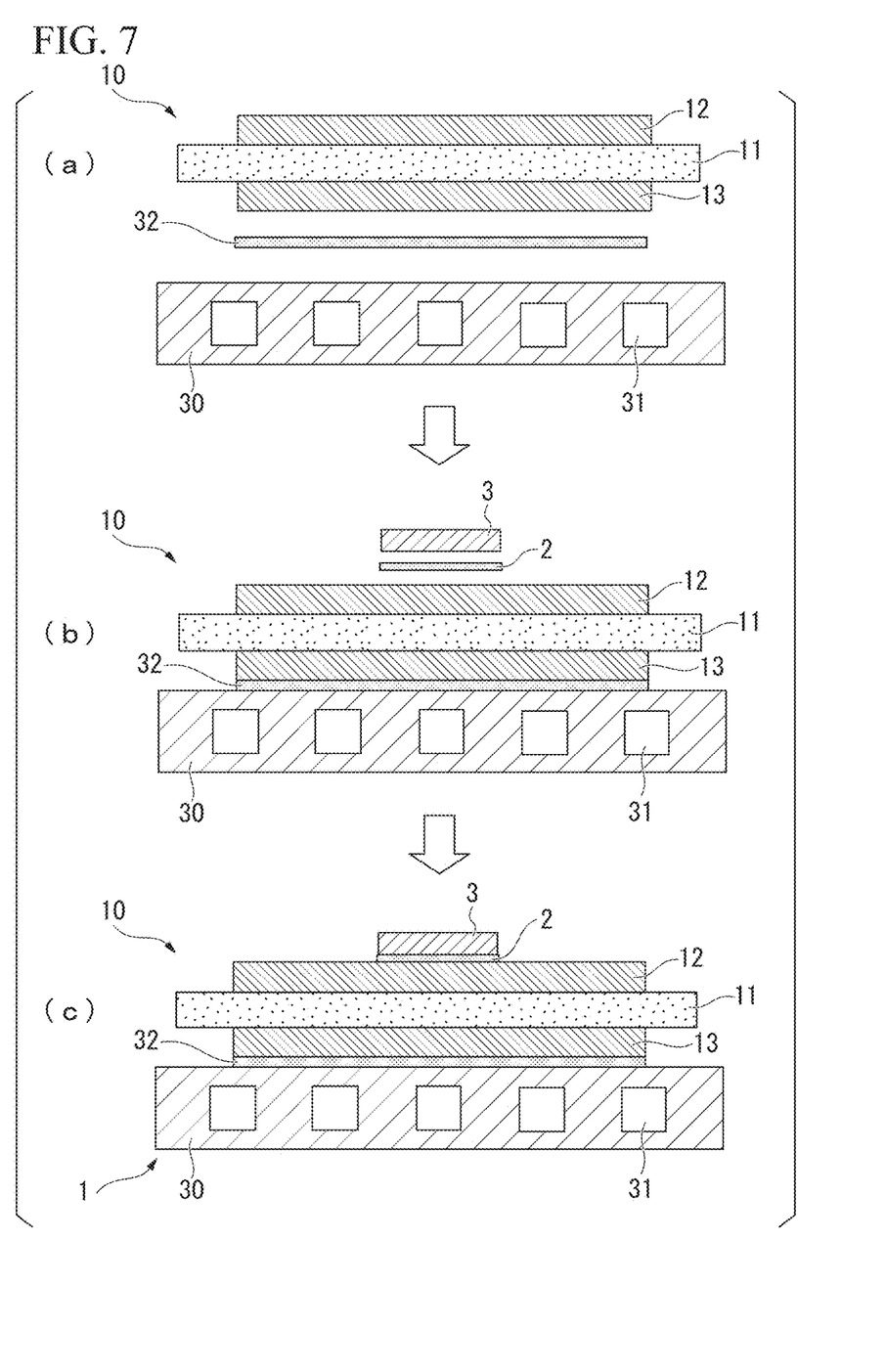
FIG. 7 is a view schematically describing a method for manufacturing a power module according to an embodiment of the present invention.

Then, as shown in FIG. 7, through a solder material as the bonding layer 32, the heat sink 30 is bonded to the lower surface of the metal layer 13 of the power module substrate 10 (FIG. 7(a)).

(Semiconductor Element Bonding Step S05)

Thereafter, as shown in FIG. 7, through a solder material, the semiconductor element 3 is bonded to the upper surface of the circuit layer 12 of the power module substrate 10 (FIGS. 7(b) and 7(c)).

In this way, the power module 1 shown in FIG. 1 is manufactured.

According to the power module substrate 10 as the present embodiment that is manufactured as described above, a circuit pattern is formed in the circuit layer 12 formed of Cu or a Cu alloy, and in the cross-sectional shape of the end portion of the circuit pattern of the circuit layer 12, the angle θ formed between the surface of the ceramic substrate 11 and the end face of the Cu—Sn layer 14 is set in a range equal to or greater than 80° and equal to or smaller than 100°. Therefore, in the end portion of the circuit pattern, a site having an acute-angled shape is not formed, and hence charge concentration can be inhibited. As a result, it is possible to inhibit the deterioration of partial discharge characteristics and voltage endurance characteristics.

Furthermore, the maximum protrusion length L of the Cu—Sn layer 14 or the Ti-containing layer 15 from the end face of the circuit layer 12 is set in a range equal to or greater than 2 μm and equal to or smaller than 15 μm. Therefore, it is possible to inhibit charges from being concentrated on the tip of the protruding portion and to inhibit the deterioration of partial discharge characteristics and voltage endurance characteristics.

In addition, in the present embodiment, as shown in FIG. 3(c), in a case where the end face of the Ti-containing layer 15 is positioned on an extended plane of the end face of the Cu—Sn layer 14 in the cross-sectional shape of the end portion of the circuit pattern of the circuit layer 12, the Cu—Sn layer 14 and the Ti-containing layer 15 are smoothly connected to each other. Accordingly, it is possible to inhibit charges from being concentrated on the interface between the Cu—Sn layer 14 and the Ti-containing layer 15 and to further inhibit the deterioration of partial discharge characteristics and voltage endurance characteristics.

Hitherto, an embodiment of the present invention has been described. However, the present invention is not limited thereto and can be appropriately modified within a scope that does not depart from the technical idea of the present invention.

In the present embodiment, a case where a metal layer formed of Cu or a Cu alloy is formed on the other surface of a ceramic substrate has been described, but the present invention is not limited thereto. The metal layer may not be formed, or a metal layer formed of Al or an Al alloy may be formed.

Figure 8:
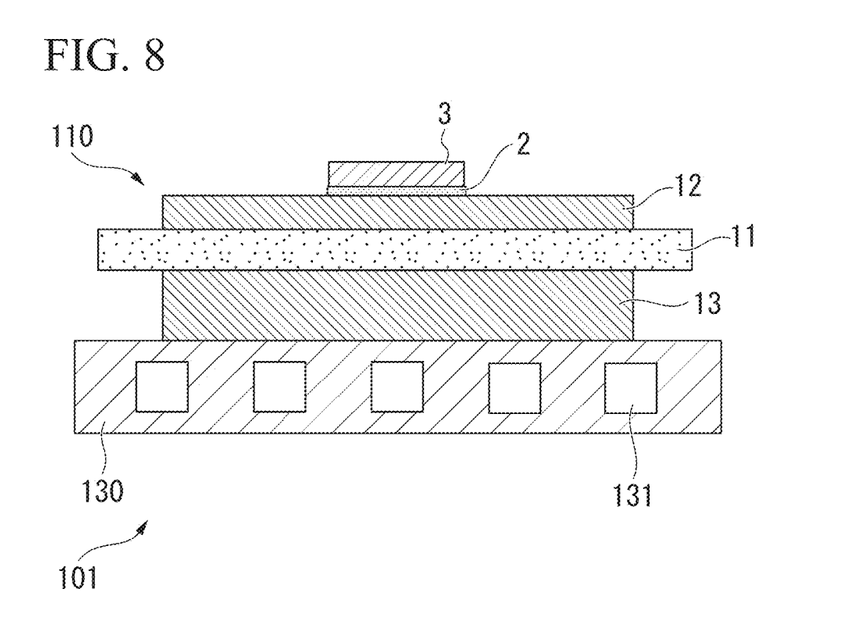
FIG. 8 is a view schematically describing a power module in which a power module substrate according to another embodiment of the present invention is used.

Specifically, as shown in FIG. 8, a power module substrate 110 may be adopted in which the circuit layer 12 formed of Cu or a Cu alloy is formed on one surface of the ceramic substrate 11, and a metal layer 113 formed of Al or an Al alloy is formed on the other surface of the ceramic substrate 11. By bonding a heat sink 130 including passages 131 and the semiconductor element 3 to the power module substrate 110, a power module 101 shown in FIG. 8 is constituted.

In the power module substrate 110, it is possible to simultaneously perform a step of forming the circuit layer 12 by bonding a copper foil to one surface of the ceramic substrate 11 by using a Cu—P—Sn-based brazing filler material and a Ti material and a step of bonding an Al foil formed of Al or an Al alloy to the other surface of the ceramic substrate 11 by using a brazing filler material. Furthermore, in a case where the heat sink 130 made of Al is used, a step of brazing the metal layer 113 and the heat sink 130 can also be simultaneously performed.

The material or the structure of the heat sink is not limited to the present embodiment, and a design change may be appropriately carried out. Alternatively, the power module substrate may not have a heat sink.

Furthermore, in the present embodiment, a constitution has been described in which the power module substrate and the heat sink are bonded to each other by using a solder material. However, a constitution may be adopted in which the power module substrate and the heat sink are fastened to each other by a screw and the like through grease provided therebetween.

In addition, the etching agent used in each of the Cu etching step S31, the Ti etching step S32, and the Cu—Sn etching step S33 is not limited to those exemplified in the present embodiment. It is preferable to select and use etching agents suitable for each of these steps, according to the material and the structure of the circuit layer, the material and the structure of the Ti-containing layer, the material and the structure of the Cu—Sn layer, and the like.

In the above embodiments, a case where a foil material of a Cu—P—Sn-based brazing filler material is used was described for example. However, the present invention is not limited thereto, and powder or paste can also be used.

Furthermore, in the above embodiments, a case where a Cu—P—Sn—Ni brazing filler material or a Cu—P—Sn brazing filler material is used as the Cu—P—Sn-based brazing filler material was described. However, other Cu—P—Sn-based brazing filler materials may also be used.

Herein, the content of P in the Cu—P—Sn-based brazing filler material is preferably equal to or greater than 3 mass % and equal to or smaller than 10 mass %.

P is an element having an operation and effect of reducing the melting start temperature of the brazing filler material. In a case where P is oxidized, P oxide occurs. P is an element having an operation and effect of coating the surface of the brazing filler material with the P oxide so as to prevent the oxidation of the brazing filler material, and coating the surface of the molten brazing filler material with the P oxide having excellent fluidity so as to improve the wettability of the brazing filler material.

In a case where the content of P is less than 3 mass %, the effect of reducing the melting start temperature of the brazing filler material may not be sufficiently obtained. Accordingly, the melting start temperature of the brazing filler material may be increased or the fluidity of the brazing filler material may become insufficient. As a result, the bonding properties between the ceramic substrate and the circuit layer may be reduced. Furthermore, in a case where the content of P is greater than 10 mass %, a large amount of brittle intermetallic compound may be formed. As a result, the bonding properties and the bonding reliability between the ceramic substrate and the circuit layer may be reduced.

For these reasons, the content of P in the Cu—P—Sn-based brazing filler material is preferably within a range equal to or greater than 3 mass % and equal to or smaller than 10 mass %.

The content of Sn in the Cu—P—Sn-based brazing filler material is preferably equal to or greater than 0.5 mass % and equal to or smaller than 25 mass %.

Sn is an element having an operation and effect of reducing the melting start temperature of the brazing filler material. In a case where the content of Sn is equal to or greater than 0.5 mass %, the melting start temperature of the brazing filler material can be reliably reduced.

In a case where the content of Sn is equal to or smaller than 25 mass %, it is possible to inhibit the brazing filler material from becoming brittle at a low temperature and to improve the bonding reliability between the ceramic substrate and the circuit layer.

For these reasons, the content of Sn in the Cu—P—Sn-based brazing filler material is preferably within a range equal to or greater than 0.5 mass % and equal to or smaller than 25 mass %.

The Cu—P—Sn-based brazing filler material may contain one kind of element or two or more kinds of elements among Ni, Cr, Fe, and Mn in an amount equal to or greater than 2 mass % and equal to or smaller than 20 mass %.

Ni, Cr, Fe, and Mn are elements having an operation and effect of inhibiting the formation of an intermetallic compound containing P in the interface between the ceramic substrate and the brazing filler material.

In a case where the content of one kind of element or two or more kinds of elements among Ni, Cr, Fe, and Mn is equal to or greater than 2 mass %, the formation of an intermetallic compound containing P in the bonded interface between the ceramic substrate and the brazing filler material can be inhibited, and the bonding reliability between the ceramic substrate and the circuit layer can be improved. Furthermore, in a case where the content of one kind of element or two or more kinds of elements among Ni, Cr, Fe, and Mn is equal to or smaller than 20 mass %, it is possible to inhibit the increase of the melting start temperature of the brazing filler material, to inhibit the decrease of the fluidity of the brazing filler material, and to improve the bonding properties between the ceramic substrate and the circuit layer.

For these reasons, in a case where the Cu—P—Sn-based brazing filler material contains one kind of element or two or more kinds of elements among Ni, Cr, Fe, and Mn, the content of the element is preferably within a range equal to or greater than 2 mass % and equal to or smaller than 20 mass %.

EXAMPLES

Examples

Hereinafter, the results of experiments performed to check the effects of the present invention will be described.

According to the procedure described in the embodiment described above, each of the Cu foils (46 mm×56 mm×0.3 mm (thickness)) shown in Table 1 and Table 2 was bonded to one surface and the other surface of each of the ceramic substrates (50 mm×60 mm×0.635 mm (thickness) (AlN), 50 mm×60 mm×0.32 mm (thickness) ($Si_3N_4$)) shown in Table 1 and Table 2, thereby forming a circuit layer and a metal layer. As the Cu foil, oxygen-free copper ("OFC" in Tables 1 and 2) or tough pitch copper ("Tough pitch" in Tables 1 and 2) was used. A Cu—P—Sn-based brazing filler material having a thickness of 25 μm was used.

Then, the etching treatment described in the embodiment described above was performed on the circuit layer, thereby forming a circuit pattern having an interwiring distance of 500 μm. Specifically, in the Cu etching step S31, by using iron chloride as an etching agent, spray etching was performed for 5 to 15 minutes at a liquid temperature of 50° C. to 70° C. In the Ti etching step S32, by using SOLFINE (SE-TW-10) manufactured by SHOWA DENKO K.K. as an etching agent, immersion etching was performed for 5 to 20 minutes by setting the liquid temperature of the etching agent to be 70° C. to 80° C. In the Cu—Sn etching step S33, by using an aqueous ammonium peroxydisulfate solution having a concentration of 1 mol/$dm^3$ as an etching agent, immersion etching was performed for 10 to 20 minutes by setting the liquid temperature of the etching agent to be 25° C.

Thereafter, a cross section of an end portion of the circuit pattern in the obtained power module substrate was observed, and the angle θ formed between the surface of the ceramic substrate and the end face of the Cu—Sn layer and the maximum protrusion length L of the Cu—Sn layer or the Ti-containing layer from the end face of the circuit layer were measured. Note that the "Form" described in Table 1 and Table 2 shows to which form the example belongs among the drawings.

During the observation of the cross section, by using a cross section polisher (SM-09010 manufactured by JEOL Ltd.), ion etching was performed on a cross section of the circuit layer (cross section which is perpendicular to the surface of the ceramic substrate and is parallel to the direction along which wiring extends in the end portion of the circuit pattern) under the conditions of an ion accelerating voltage: 5 kV, a processing time: 14 hours, and a protrusion amount from a masking shield: 100 μm, and then the end portion of the circuit pattern was observed using a scanning electron microscope (SEM).

For evaluating the voltage endurance characteristics of the obtained power module substrates, a cycle was repeated in which each of the power module substrates was immersed in insulating oil (FLUORINERT FC-770 manufactured by 3M), voltage was increased to 0.5 kV for 5 seconds, and then the power module substrate was kept as it was for 30 seconds. A voltage at a point in time when the amount of discharged charges exceeded 10 pC while the power module substrate was being kept as it was taken as a partial discharge start voltage, and partial discharge characteristics were evaluated. The evaluation results are shown in Table 1 and Table 2.

TABLE 1

| | | | Cross-sectional shape of end portion of circuit pattern | | | Evaluation |
|---|---|---|---|---|---|---|
| | Ceramic substrate | Cu foil | Angle θ (°) | Maximum protrusion length L (μm) | Form | Partial discharge start voltage (kV) |
| Example 1 | AlN | OFC | 88 | 2.3 | FIG. 3(a) | 11.0 |
| Example 2 | AlN | OFC | 91 | 14.7 | FIG. 3(a) | 8.5 |
| Example 3 | AlN | OFC | 85 | 2.3 | FIG. 3(c) | 11.0 |

TABLE 1-continued

|  | Ceramic substrate | Cu foil | Cross-sectional shape of end portion of circuit pattern ||| Evaluation |
|---|---|---|---|---|---|---|
|  |  |  | Angle θ (°) | Maximum protrusion length L (μm) | Form | Partial discharge start voltage (kV) |
| Example 4 | AlN | OFC | 95 | 14.7 | FIG. 3(c) | 8.5 |
| Example 5 | AlN | OFC | 81 | 9.8 | FIG. 3(c) | 9.0 |
| Example 6 | AlN | OFC | 98 | 8.6 | FIG. 3(c) | 10.0 |
| Example 7 | AlN | OFC | 93 | 2.2 | FIG. 4(d) | 10.5 |
| Example 8 | AlN | OFC | 87 | 14.8 | FIG. 4(d) | 8.5 |
| Example 9 | AlN | OFC | 82 | 9.8 | FIG. 4(d) | 9.0 |
| Example 10 | AlN | OFC | 99 | 8.6 | FIG. 4(d) | 9.5 |
| Example 11 | AlN | OFC | 94 | 8.8 | FIG. 4(e) | 9.5 |
| Example 12 | AlN | OFC | 86 | 9.2 | FIG. 4(f) | 9.0 |
| Example 13 | AlN | TOUGH PITCH | 87 | 5.3 | FIG. 3(c) | 9.5 |
| Comparative Example 1 | AlN | OFC | 87 | 30.0 | FIG. 3(c) | 7.0 |
| Comparative Example 2 | AlN | OFC | 65 | 8.6 | FIG. 3(c) | 7.0 |
| Comparative Example 3 | AlN | OFC | 112 | 9.4 | FIG. 3(c) | 7.5 |

TABLE 2

|  | Ceramic substrate | Cu foil | Cross-sectional shape of end portion of circuit pattern ||| Evaluation |
|---|---|---|---|---|---|---|
|  |  |  | Angle θ (°) | Maximum protrusion length L (μm) | Form | Partial discharge start voltage (kV) |
| Example 14 | $Si_3N_4$ | OFC | 89 | 2.2 | FIG. 3(a) | 9.5 |
| Example 15 | $Si_3N_4$ | OFC | 91 | 14.5 | FIG. 3(a) | 7.0 |
| Example 16 | $Si_3N_4$ | OFC | 87 | 2.3 | FIG. 3(c) | 9.5 |
| Example 17 | $Si_3N_4$ | OFC | 94 | 14.8 | FIG. 3(c) | 7.0 |
| Example 18 | $Si_3N_4$ | OFC | 80 | 9.5 | FIG. 3(c) | 7.0 |
| Example 19 | $Si_3N_4$ | OFC | 99 | 7.9 | FIG. 3(c) | 8.5 |
| Example 20 | $Si_3N_4$ | OFC | 92 | 2.3 | FIG. 4(d) | 9.0 |
| Example 21 | $Si_3N_4$ | OFC | 85 | 14.6 | FIG. 4(d) | 7.0 |
| Example 22 | $Si_3N_4$ | OFC | 82 | 8.6 | FIG. 4(d) | 7.5 |
| Example 23 | $Si_3N_4$ | OFC | 99 | 8.8 | FIG. 4(d) | 7.5 |
| Example 24 | $Si_3N_4$ | OFC | 93 | 8.6 | FIG. 4(e) | 8.0 |
| Example 25 | $Si_3N_4$ | OFC | 86 | 8.7 | FIG. 4(f) | 7.5 |
| Example 26 | $Si_3N_4$ | TOUGH PITCH | 88 | 4.9 | FIG. 3(c) | 8.0 |
| Comparative Example 4 | $Si_3N_4$ | OFC | 87 | 30.0 | FIG. 3(c) | 5.0 |
| Comparative Example 5 | $Si_3N_4$ | OFC | 67 | 8.7 | FIG. 3(c) | 5.5 |
| Comparative Example 6 | $Si_3N_4$ | OFC | 115 | 8.2 | FIG. 3(c) | 5.5 |

Regarding the results shown in Table 1 obtained by using AlN as a ceramic substrate, it was understood that in the examples of the present invention, in which the angle θ formed between the surface of the ceramic substrate and the end face of the Cu—Sn layer is set in a range equal to or greater than 80° and equal to or smaller than 100° and the maximum protrusion length L of the Cu—Sn layer or the Ti-containing layer from the end face of the circuit layer is set in a range equal to or greater than 2 μm and equal to or smaller than 15 μm, a power module substrate is obtained which has a high partial discharge start voltage and is excellent in partial discharge characteristics and voltage endurance characteristics.

The results shown in Table 2 obtained using $Si_3N_4$ as a ceramic substrate were the same as the results obtained using AlN.

INDUSTRIAL APPLICABILITY

According to the present invention, it is possible to inhibit the occurrence of partial discharge in a circuit layer formed on one surface of the ceramic substrate and to inhibit the occurrence of short-circuit even though a fine circuit pattern is formed. Therefore, the present invention is suitable for power semiconductor elements for high power control that are used for controlling wind power generation and electric vehicles such as electric cars.

REFERENCE SIGNS LIST 10, 110 power module substrate
11 ceramic substrate
12 circuit layer
14 Cu—Sn layer
15 Ti-containing layer

The invention claimed is:

1. A power module substrate comprising:
a ceramic substrate; and
a circuit layer which is formed on one surface of the ceramic substrate and has a circuit pattern,
wherein the circuit layer is made of Cu or a Cu alloy,
in an interface between the circuit layer and the ceramic substrate, a Cu—Sn layer in which Sn forms a solid solution in Cu and a Ti-containing layer containing Ti are laminated in this order from the ceramic substrate side, and
in a cross-sectional shape of an end portion of the circuit pattern of the circuit layer, an angle θ formed between a surface of the ceramic substrate and an end face of the Cu—Sn layer is set in a range equal to or greater than 80° and equal to or smaller than 100°, and a maximum protrusion length L of the Cu—Sn layer or the Ti-containing layer from an end face of the circuit layer is set in a range equal to or greater than 2 μm and equal to or smaller than 15 μm.

2. The power module substrate according to claim 1, wherein in the cross-sectional shape of the end portion of the circuit pattern of the circuit layer, an end face of the Ti-containing layer is positioned on an extended plane of the end face of the Cu—Sn layer.

\* \* \* \* \*